(12) United States Patent
Apfelthaler (10) Patent No.: US 8,643,384 B2
(45) Date of Patent: Feb. 4, 2014

(54) METHOD AND DEVICE FOR CHECKING THE ELECTRICAL INSULATION AS WELL AS A METHOD AND SYSTEM FOR PRODUCING PHOTOVOLTAIC MODULES

(75) Inventor: Harald Apfelthaler, Langenzenn (DE)

(73) Assignee: Harrexco AG, Langenzenn (DE)

( * ) Notice: Subject to any disclaimer, the term of this patent is extended or adjusted under 35 U.S.C. 154(b) by 400 days.

(21) Appl. No.: 12/988,354

(22) PCT Filed: Apr. 17, 2009

(86) PCT No.: PCT/EP2009/002825
§ 371 (c)(1),
(2), (4) Date: Feb. 10, 2011

(87) PCT Pub. No.: WO2009/127422
PCT Pub. Date: Oct. 22, 2009

(65) Prior Publication Data
US 2011/0148432 A1    Jun. 23, 2011

(30) Foreign Application Priority Data

Apr. 18, 2008  (DE) .......................... 10 2008 019 703

(51) Int. Cl.
*G01R 31/12* (2006.01)
(52) U.S. Cl.
USPC ..................................... 324/551; 324/761.01
(58) Field of Classification Search
USPC ................. 235/435–439, 454, 462, 487–488; 324/332, 551, 761.01; 136/206, 252; 257/79–83, 98, 678–679
See application file for complete search history.

(56) References Cited

U.S. PATENT DOCUMENTS

| | | | |
|---|---|---|---|
| 2001/0040453 A1* | 11/2001 | Toyomura et al. | 324/332 |
| 2004/0261832 A1* | 12/2004 | Haga et al. | 136/206 |
| 2005/0034754 A1* | 2/2005 | Schmidt | 136/256 |
| 2008/0163918 A1* | 7/2008 | Li | 136/244 |

FOREIGN PATENT DOCUMENTS

JP            2004047838 A      2/2004

* cited by examiner

*Primary Examiner* — Melissa Koval
*Assistant Examiner* — Brent J Andrews
(74) *Attorney, Agent, or Firm* — Laurence A. Greenberg; Werner H. Stemer; Ralph E. Locher (57) ABSTRACT

An electrical insulation test as well as the production of photovoltaic modules, especially of thin-film photovoltaic modules, provides a current-conducting component disposed on a panel-shaped substrate, which are insulated electrically in the area of the module edge. In order to simplify testing of the insulation of such photovoltaic modules, it is proposed that, during the production of the photovoltaic module, testing of the electrical insulation takes place, for which, through the use of a mechanical contacting device a test voltage is applied between the module edge on the one hand and the electrical connections of the photovoltaic module, which are remote from the module edge, lead to the outside, on the other hand.

15 Claims, 3 Drawing Sheets

METHOD AND DEVICE FOR CHECKING THE ELECTRICAL INSULATION AS WELL AS A METHOD AND SYSTEM FOR PRODUCING PHOTOVOLTAIC MODULES

BACKGROUND OF THE INVENTION

Field of the Invention

The invention relates to a method and a device for electrical insulation testing of photovoltaic modules, and to a method and a system for production of photovoltaic modules in which current-carrying components are arranged on a substrate in the form of a board and are electrically insulated at least, but not necessarily exclusively, in the area of the module edge.

It is critical to the life of photovoltaic modules with thin-film solar cells which are based on layer thick-nesses in the micrometer range, and to ensure the safety of such modules in accordance with the specified standards (IEC 61646/1996, IEC 61730/2004) how well the thin films are electrically insulated toward the outside edge, and are protected against weathering and other environmental influences, as well as against current leakage. Once current-carrying layers have been applied to a substrate, the edge area of the substrate is therefore de-coated again and, at least in this edge area, the substrate is laminated, that is to say it is provided with a laminate layer, thus ensuring that the solar cells are encapsulated in a moisture-tight manner, while at the same time ensuring adequate electrical insulation of the current-carrying components.

If moisture can enter the edge area of the photovoltaic module from the outside, then this can not only lead to the solar cell being damaged or destroyed.

The required electrical insulation of the current-carrying components and therefore the operational reliability of the module may also be inadequate for this reason. In order to check this, it is known for the photovoltaic modules to be subjected to an electrical insulation test.

Depending on the type suitability and approval, as well as the safety standard, the electrical insulation test is carried out by applying a high voltage to test whether the photovoltaic module is insulated toward the edge. The applied high voltage is generally between 3000 V and 6000 V, depending on the system voltage and the standard, and depending on whether the module does or does not have an insulating frame. The test is used to determine whether a leakage current is formed. This can occur because of faulty de-coating, if a residual coating is still present in the edge area of the substrate. However, a leakage current may also be caused by contamination of the edge area, for example by dust particles, for example as a result of the de-coating of the substrate. Another reason for a leakage current may be a microstructure, in the form of very small damage to the substrate surface, occurring in the edge area of the substrate as a result of the de-coating process, in which moisture accumulates. Finally, leakage current may also be present because of the use of a conductive and therefore faulty lamination film, as can occur, for example, as a result of incorrect storage. The electrical insulation test therefore also checks the dielectric strength of the laminate.

For the electrical insulation test, it is necessary for the methods known from the prior art for the photo-voltaic module to be placed in a water bath, that is to say to be wetted completely. However, this type of contact-making process has a number of disadvantages. From the manufacturing point of view, the test is highly complex. It is therefore not carried out on all the photovoltaic modules being produced. Instead of this, only selected photovoltaic modules are tested, on a sample basis. Furthermore, it is possible for a contact which completely wets the photovoltaic module to damage the photovoltaic module.

BRIEF SUMMARY OF THE INVENTION

An object of the present invention is to simplify the insulation test for photovoltaic modules, in particular for thin-film photovoltaic modules, and to improve the quality of photovoltaic modules.

This object is achieved by a method for electric insulation testing of photovoltaic modules, in particular of thin-film photovoltaic modules, in which current-carrying components are arranged on a substrate in the form of a board and are electrically insulated in the area of the module edge, wherein, during the electrical insulation test, a test voltage is applied by a mechanical contact-making apparatus between the module edge on the one hand and those electrical connections of the photovoltaic module which lead to the outside at a distance from the module edge on the other hand.

Another object is achieved by a method for improving the insulation characteristics of photovoltaic modules, in particular of thin-film photovoltaic modules, in which current-carrying components are arranged on a substrate in the form of a board and are electrically insulated in the area of the module edge, wherein a method for electrical insulation testing as described above is carried out, in which the test voltage is in the range from 8 kV to 20 kV.

A further object is achieved by a method for producing photovoltaic modules in which current-carrying components are arranged on a substrate in the form of a board and are electrically insulated in the area of the module edge, wherein an electrical insulation test of photovoltaic modules according to the method described above is carried out during the production of the photovoltaic modules.

Still yet another object is achieved by a device for electrical insulation testing of photovoltaic modules, in particular of thin-film photovoltaic modules, in which current-carrying components are arranged on a substrate in the form of a board and are electrically insulated in the area of the module edge, wherein a test voltage is applied by a mechanical contact-making apparatus between the module edge on the one hand and those electrical connections of the photovoltaic module which lead to the outside at a distance from the module edge on the other hand.

Still yet a further object is achieved by a system for production of photovoltaic modules, in particular thin-film photovoltaic modules, in which current-carrying components are arranged on a substrate in the form of a board and are electrically insulated in the area of the module edge, wherein the system has a device for carrying out an electrical insulation test as described in the various embodiments herein.

According to the invention, an electrical insulation test is carried out during the production of the photovoltaic modules, in which test a test voltage is applied by means of a mechanical contact-making apparatus between the module edge on the one hand and those electrical connections of the photovoltaic module which lead to the outside at a distance from the module edge on the other hand.

In contrast to the "completely wetted contact" known from the prior art, a mechanical contact-making apparatus is used. This contact-making apparatus can be integrated in a simple manner in the production process of the photovoltaic modules. For example, the electrical insulation test can be integrated as a process step in the production line.

The present invention takes account of the fact that the previously carried-out sample-based electrical insulation test is no longer consistent with the more stringent quality and safety requirements of consumers. The use of the present invention makes it possible to ensure that every individual photovoltaic module is subjected to quality control, without any gaps. Expensive faults during production which, if they remain unidentified, can lead to costly recall actions by the manufacturer, can be quickly identified by the present invention. The production of the photovoltaic modules can be stopped immediately after a fault is found, in order to search for the cause of the fault, and to rectify the fault. In this case, the proportion of faulty photovoltaic modules is restricted to the small number of modules which are actually being manufactured at this time. Situations in which it has no longer been possible to sell an entire day's production because of quality and safety defects, because the insulation test had been carried out only on selected photovoltaic modules, are therefore a thing of the past.

It is particularly advantageous for the method to be carried out on a production line and for the electrical insulation test to be carried out in series with the other production steps or in the course of one of these production steps. In other words, the insulation testing step is either carried out as an additional "production step" using a separate device designed for the insulation test, or else the device for carrying out the insulation test is integrated in one of the devices which are required in any case for the production of the photovoltaic modules, such that the insulation test is carried out in the course of a production step, for example in the course of the edge de-coating.

An "in-line" test such as this allows every individual photovoltaic module to be tested, in a particularly simple manner. Depending on the point at which the insulation test is carried out in the production line, the down time in the event of a faulty module can be reduced to a greater or lesser extent. For example, if the insulation test is carried out directly after edge de-coating and before the very time-consuming lamination process, then faults during de-coating can be identified at an early stage, thus making it possible to avoid lamination of faulty modules. In contrast, if the insulation test is used after the lamination step, the quality of the lamination film can be checked, which is of major importance overall for the quality and safety analysis. The technology proposed according to the invention is therefore preferably used at the end of the production of a module. Equally, advantages may also result from use at earlier times (see above).

If the insulation test is carried out directly after the edge de-coating, then one preferred embodiment of the invention provides that the device for carrying out the insulation test is integrated in the device for edge de-coating. In other words, the photovoltaic modules which have been de-coated at the edge are not passed from the edge de-coating module to a separate device for carrying out the electrical insulation test, but the insulation test is instead carried out in the edge de-coating module itself. If the production process is controlled appropriately, this allows the quality of the photovoltaic modules to be improved in a particularly simple manner, since those photovoltaic modules which do not pass the insulation test are de-coated a second time immediately in the edge de-coating module.

Overall, a particularly intelligent system for production of photovoltaic modules can be created by the use of the insulation test during or in conjunction with the edge-de-coating, the lamination and/or further production steps, in which system individual modules which do not pass the insulation test can automatically be processed directly again, or else can be fed back for one or more production steps to be repeated.

It is, of course, also possible in principle during "in-line" testing to test only samples of the photovoltaic modules to be manufactured. This would be feasible by suitable control of the test device. However, a one hundred percent test is preferred in order to achieve the best possible quality and safety level.

In addition to the "in-line" use of the electrical insulation test in the course of a production line, it is likewise possible to carry out the insulation test as an "island solution", that is to say at a place and/or at a time separated from the production of the modules in the production line. On the one hand, this can be carried out such that photovoltaic modules which have already been completely assembled are tested in an "island solution" such as this. On the other hand, the insulation test can also be used as an "island solution" when the production process is being carried out on two or more production lines, in which case those photovoltaic modules which leave the first production line are tested within the "island solution", before they are supplied to the subsequent production line. In the case of the "island solution", it is also possible either to test all the modules or else to carry out the tests only on a sample basis.

In both cases, that is to say both "in-line" and in the case of the "island solution" it may be advantageous to carry out the electrical insulation test more than once, for example before and after the laminate layer is applied to the substrate. A multiple test such as this makes it possible to reduce the scrap rate from the production of the photovoltaic modules even further.

The voltage ramp which is used for the insulation test differs from the voltage ramp in previous tests in that considerably higher voltages are preferably applied. According to one preferred embodiment of the invention, the applied voltages are in the range from 5 kV to 20 kV. In any case, the applied voltages correspond, however, to at least the respective relevant Standard. Furthermore, the voltage ramp is passed through considerably more quickly than in the past, specifically preferably at least 500 V/s. The test can be carried out at up to 10 kV/s. This makes it possible to reduce the test time from about 5 minutes for each insulation test to less than one minute, and preferably to less than 5 seconds, which is particularly advantageous for a uniform process sequence when used "in-line".

Furthermore, when using high voltages in the range from 8 kW to 20 kV, it has surprisingly been found that the insulation characteristics of the tested photovoltaic modules are improved, provided that the modules have only a small amount of current leakage. In contrast, modules with high current leakage deteriorate considerably, generally with visible leakage current paths being formed. The use of high voltages such as these for the insulation test therefore results in an effect that the quality of the insulation characteristics of better modules which, however, are not 100% insulation-resistant, is improved, while the quality of the insulation characteristics of poorer modules deteriorates. The last-mentioned modules are then removed from the production process, while the modules which have been improved by the insulation test can remain in the production process, having passed the test. The improvement in the insulation characteristics can possibly be explained by the high voltage that is used leading to annealing of conductive particles, and therefore to a cleaning effect.

A further embodiment of the invention provides for a contact-making test to be carried out before the insulation test is carried out on the individual photovoltaic modules. This contact-making test is used to check whether the contact elements of the contact-making apparatus are electrically connected to the module edge and to the electrical connections of the photovoltaic module to be tested. This makes it possible to prevent the insulation test giving a positive result, despite the module being faulty. This situation could occur, for example, if the contact element were not correctly electrically connected, for example because of a faulty contact being made with a connecting socket (see below).

The system according to the invention for production of photovoltaic modules has a device for carrying out the electrical insulation test. Depending on whether the test is intended to be an "in-line" or "island solution" test, this device is designed as a module in the production line or else as a "stand-alone" device. In both cases, contact is made by means of a mechanical contact-making apparatus.

In one embodiment of the invention, the contact-making apparatus has a contact frame for making contact with the module edge, which contact frame has at least one contact element in the form of a strip. In this case, contact is made with the module edge by making contact with the end face of the finished module, the end face of the substrate and/or the upper face of the substrate in the edge area of the module. The contact frame is in this case designed to surround the module. In this case, it preferably surrounds the module without any gaps. This can either be achieved by using a continuous, integral contact element which surrounds the module without any gaps, or alternatively by using a contact frame with a plurality of contact elements which overlap in their end areas, thus making it possible to ensure that the module is surrounded without any gaps, in this case as well.

In a further embodiment of the invention, the contact-making apparatus has a contact roller which is provided with a contact element which is preferably in the form of a ribbon, which contact roller is designed to make peripheral contact with the module edge in places. In this case, a cylindrical contact roller is provided with a contact ribbon on its outer face and leaves the module edge, to be precise making contact with the module or substrate end face and/or making contact with the substrate upper face in the edge area. The leaving process in this case takes place section by section, that is to say "in steps", in which case "step-by-step" leaving can be understood to mean not only leaving the module edge continuously but also interrupted by pauses. In this embodiment, it is possible to exactly locate any possible breakdown or weaknesses in the electrical insulation. Both embodiments (contact frame and contact roller) can be used in a joint production line.

Furthermore, the contact-making apparatus has a contact stamp for making contact with the electrical connections of the photovoltaic module, in which case the contact stamp is provided with a contact element which is preferably in the form of a ball or cushion.

It has been found to be particularly advantageous for the contact element or contact elements of the contact frame and/or the contact element of the contact roller and/or the contact element of the contact stamp to be composed of an electrically conductive, textile fabric, that is to say a fabric into which metallic elements are woven. As an alternative to this, it is also possible, for example, to use electrically conductive fibers or fabric, metal wool or steel wool, or moistened sponge cloths, conductive foam or conductive rubber, etc. If a flexible copper-beryllium fabric tube is used as the contact-making material, the elasticity of the fabric allows contact to be made particularly well even when there are geometric irregularities on the module edge. Furthermore, this material is distinguished by having a particularly long life.

The use of materials such as these ensures that the contact element is sufficiently elastic to avoid mechanical damage to the photovoltaic module, but at the same time ensuring that an adequate electrical contact is made, when mechanical contact is made with the photovoltaic module by pressing on the contact frame or the contact stamp. Instead of these materials, it is also possible to use conventional metallic contact sheets or contact films, also in the form of textiles wetted with a conductive liquid, in which case these are then advantageously mounted suitably in a sprung or springing manner, in order not to damage the comparatively sensitive module during the contact-making process.

If moistened sponge cloths or similar materials are used, which allow metered moistening of the contact elements in order to produce or improve their electrical conductivity, a very reliable moist contact can be made which, however and in contrast to the "complete bath" wetting processes known from the prior art, is based only on partial wetting of the modules to be tested with liquid, specifically only the wetting which is required in the immediate contact area.

Instead of complete immersion of the modules in a water bath, the module is only partially wetted, by the moisture which adheres to the contact elements. This avoids the problems which occur with complete wetting, in particular the risk of damage to the module.

The process of making electrical contact with the photovoltaic module to be tested is particularly important. Contact is preferably made independently of the position in which the photovoltaic module is transported and supplied to the test device. By way of example, this can be done by manipulators, roller tracks, compressed air, etc. The photovoltaic modules can be transported and tested horizontally or vertically.

The contact with the photovoltaic modules which is required for the insulation test is preferably made automatically. However, as an alternative to this, contact can also be made completely manually or else semi-automatically. When contact is made fully automatically, the contact frame and/or contact stamp are positioned and/or operated by appropriate drive apparatuses, for example pneumatic or hydraulic drives, or else electric-motor drives. When the photovoltaic module to be tested is located in the test position, then, for example, the module can first of all be surrounded by the contact frame before the contact stamp is pressed onto the exposed electrical connections of the photovoltaic module which lead to the outside. Alternatively, contact can automatically be made with the frame by moving the photovoltaic module toward the frame. In this case, on the one hand, a lever pivoting solution can be provided, according to which the module to be tested in the method positively acts on a lever arm of the contact-making apparatus when in the test position, with the contact element of the contact frame making contact with the module edge by pivoting of the lever arm. In another variant, a clamping solution is implemented, in which the module to be tested is automatically clamped between the contact elements by moving to the test position. In both cases, the photovoltaic module to be tested is moved to the lever arms or the contact elements for example with the aid of a lifting table which is driven by toothed rods.

If neither the lever pivoting solution nor the clamping solution is used, the contact frame is preferably in three parts, with an L-shaped part of the frame being provided, corresponding to the board shape of the photovoltaic module, to which L-shaped part two straight frame elements are attached either directly, that is to say at both ends of the L-section, or "in a row". The contact frame is then first of all attached by means of the L-shaped element to the module to be tested, before the two further frame elements which, for example, are connected to the L-shaped element by hinges or the like, are moved to the two remaining sides of the module, and make contact with them.

All three contact options for fitting the frame to the photovoltaic module, as well as the described variant with a contact roller, can also be used when contact is not made automatically, but manually. A contact stamp can also be used to make contact manually and is placed onto those electrical connections of the photovoltaic module which lead to the outside. However, if the photovoltaic module has already been completed, in which the two electrical connections are already provided with a connecting socket or with connecting plugs, as are used for connection of the photovoltaic module in a photovoltaic module array, contact is advantageously not made with the electrical connections with the aid of a contact stamp, but by making contact with the connecting socket or the connecting plug with the aid of a preferably plug-in contact adapter. This can be done for both the manual and the automatic contact-making variant.

In order to carry out the test, the photovoltaic module to be tested can alternatively be provided with a provisional, open connecting socket (test socket), which is closed after the test. No plug-in contact adapter is required to make contact with this test socket. The already described contact stamp can be used instead of this. The use of a test socket such as this allows the contact stamp to make contact particularly accurately and safely with the module, since, in this case, the contact stamp need not be placed on more or less loose electrical connections which lead to the outside but at defined contact-making points, in the form of a test socket.

If contact is made with the connecting socket or the connecting plug of the photovoltaic module with the aid of a plug-in contact adapter (see above), then, in one embodiment of the invention, an auxiliary apparatus which is in the form of a holding and connecting apparatus is provided for automatically making a mechanical connection between the connecting socket or plug on the one hand and the contact adapter on the other hand. The auxiliary apparatus is in this case preferably designed such that it simultaneously holds or grips the connecting socket or the connecting plug on the one hand and/or the contact adapter on the other hand, (if necessary), positions them and/or aligns them with respect to one another, and connects them to one another by a defined connection movement. This embodiment of the invention allows for further automation of the test process, and considerably reduces the cycle time.

In one embodiment of the invention, the contact adapter and the contact stamp form a unit, such that a single apparatus can be used to test both modules with exposed electrical connections and modules with a connecting socket and/or connecting plugs. In this case, the contact stamp and contact adapter can also be operated and moved jointly.

BRIEF DESCRIPTION OF THE SEVERAL VIEWS OF THE DRAWING

Exemplary embodiments of the invention will be explained in more detail below with reference to the drawings, in which.

DESCRIPTION OF THE INVENTION

All the figures illustrate the invention only schematically and with its essential components. In this case, the same reference symbols correspond to elements having the same or a comparable function.

Figure 1:
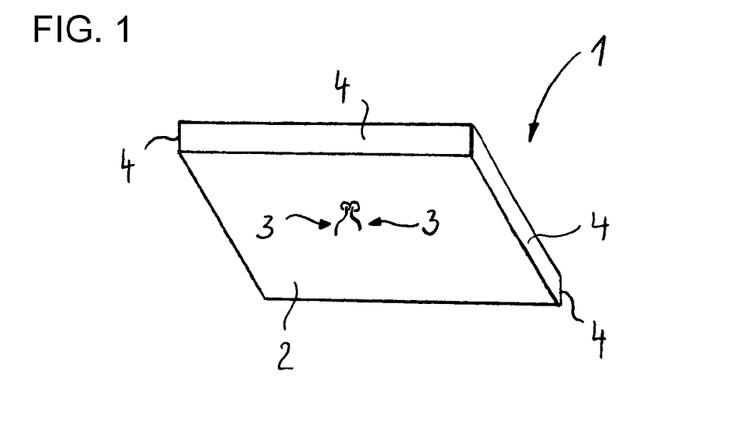
FIG. 1 shows a perspective view of a photovoltaic module,
FIG. 2 show a section view through a photovoltaic module.

A thin-film photovoltaic module 1 to be tested is shown from underneath, in the form of a perspective view, in FIG. 1. The module 1 is in the form of a board and, on its rear face 2, has two electrical connections 3. These are used to connect the module 1 in a photovoltaic module array, for example for a photovoltaic module installation on a house roof. The module has four end faces 4. In this case, the module has a height of a few millimeters to a centimeter.

Figure 2:
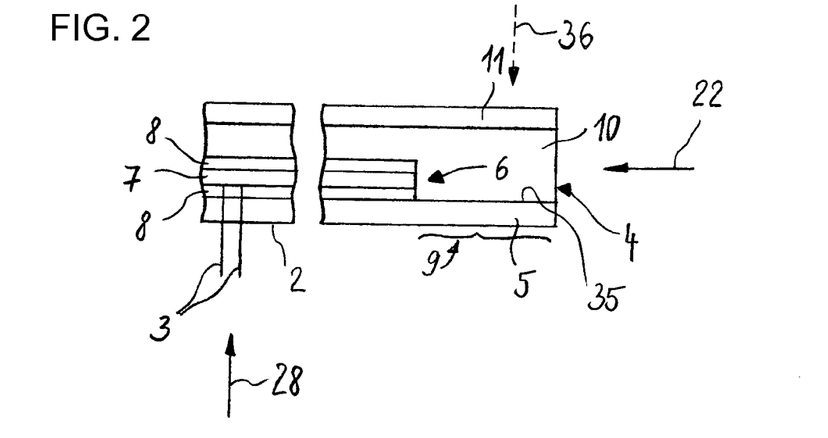

The layer structure of a thin-film module 1 is illustrated in FIG. 2. A current-carrying component 6 is fitted to a glass substrate 5 and consists of three strata, wherein the center stratum is formed by the actual semiconductor layer 7, and the two outer strata are formed by TCO material 8 (transparent conductive oxide). After the current-carrying component 6 has been fitted, this is removed again in the edge area 9 of the module 1, for example by the use of a laser process. This is referred to as edge de-coating. The current-carrying component 6 is then encapsulated with laminate 10. The structure of the module 1 is closed by an upper cover plate 11, which is likewise generally composed of glass. The end faces 4 of the module 1 are closed by the laminate layer 10 such that they are moisture-tight, and are at the same time electrically insulated. The object of the electrical insulation test is to check this.

When producing modules 1 such as these, in which current-carrying components 6 are arranged on a substrate 5 in the form of a board and are electrically insulated in the area of the module edge, an electrical insulation test is carried out according to the invention, in which a mechanical contact-making apparatus, as a component of a device for carrying out the electrical insulation test, is used to apply a test voltage between the module edge on the one hand and those electrical connections 3 of the module 1 which lead from the module edge to the outside, on the other hand. If the substrate 5 has already been provided with the laminate layer 10, the voltage is preferably applied between the connections 3 and the end face 4 of the module 1 (with or without the cover plate 11). If the insulation test is carried out before the lamination process, the voltage is preferably applied between the connections 3 and the end face of the substrate 5 and/or the substrate upper face 35 in the edge area 9.

Figure 3:
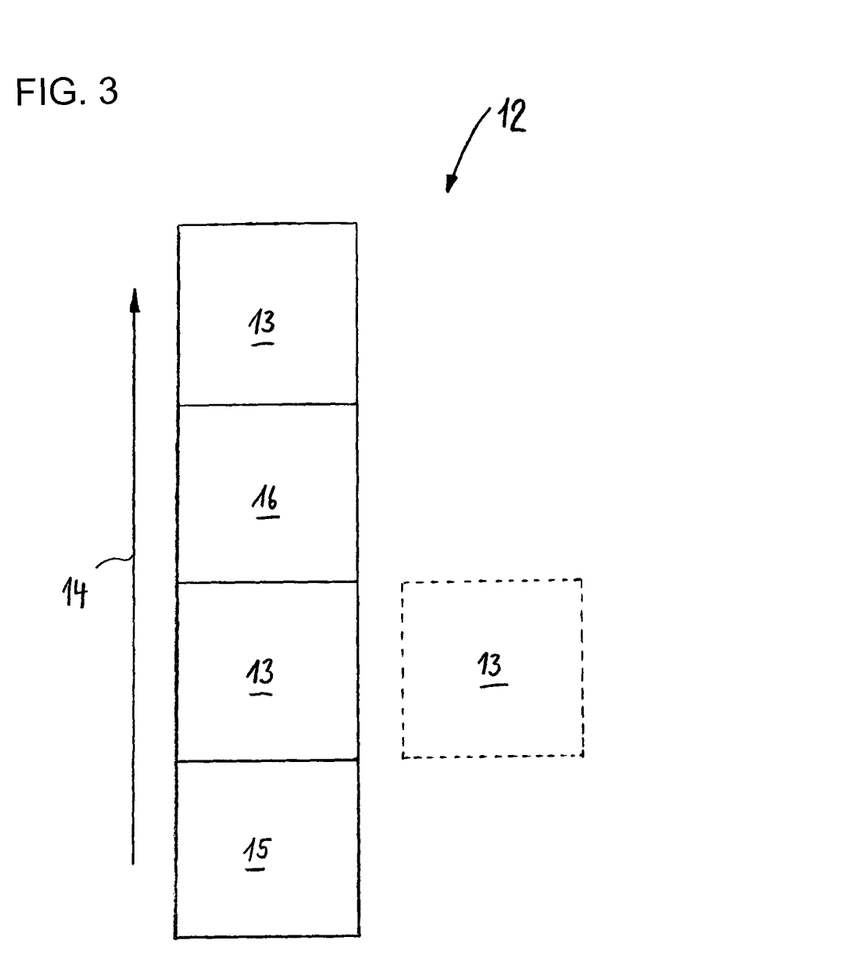
FIG. 3 shows a plan view of a production line.

The electrical insulation test is preferably integrated as a process step in a production line 12 for production of the photovoltaic modules, and is carried out in series with the other production steps, cf. FIG. 3. By way of example, the insulation test is carried out directly after the edge de-coating and before the highly time-consuming lamination process. The device 13 for carrying out the electrical insulation test is then in the form of a module of the production line 12 and is positioned between the edge de-coating module 15 and the lamination module 16 in the process direction 14. In order to reduce the scrap rate further, a second test device 13 is provided after the lamination process in the production line 12.

As an alternative to this, it is possible to carry out the electrical insulation test as an "stand-alone solution", as is indicated in FIG. 3 by the test device 13 being offset from the production line 12.

Contact is made with the module 1 manually, semi-automatically or fully automatically by means of a mechanical contact-making apparatus. This comprises a contact frame 17 for making contact with the end faces 4, and a contact stamp 18 for making contact with the electrical connections 3 of the module 1.

Figures 4, 5, 6, 7, 8, 9, 11:
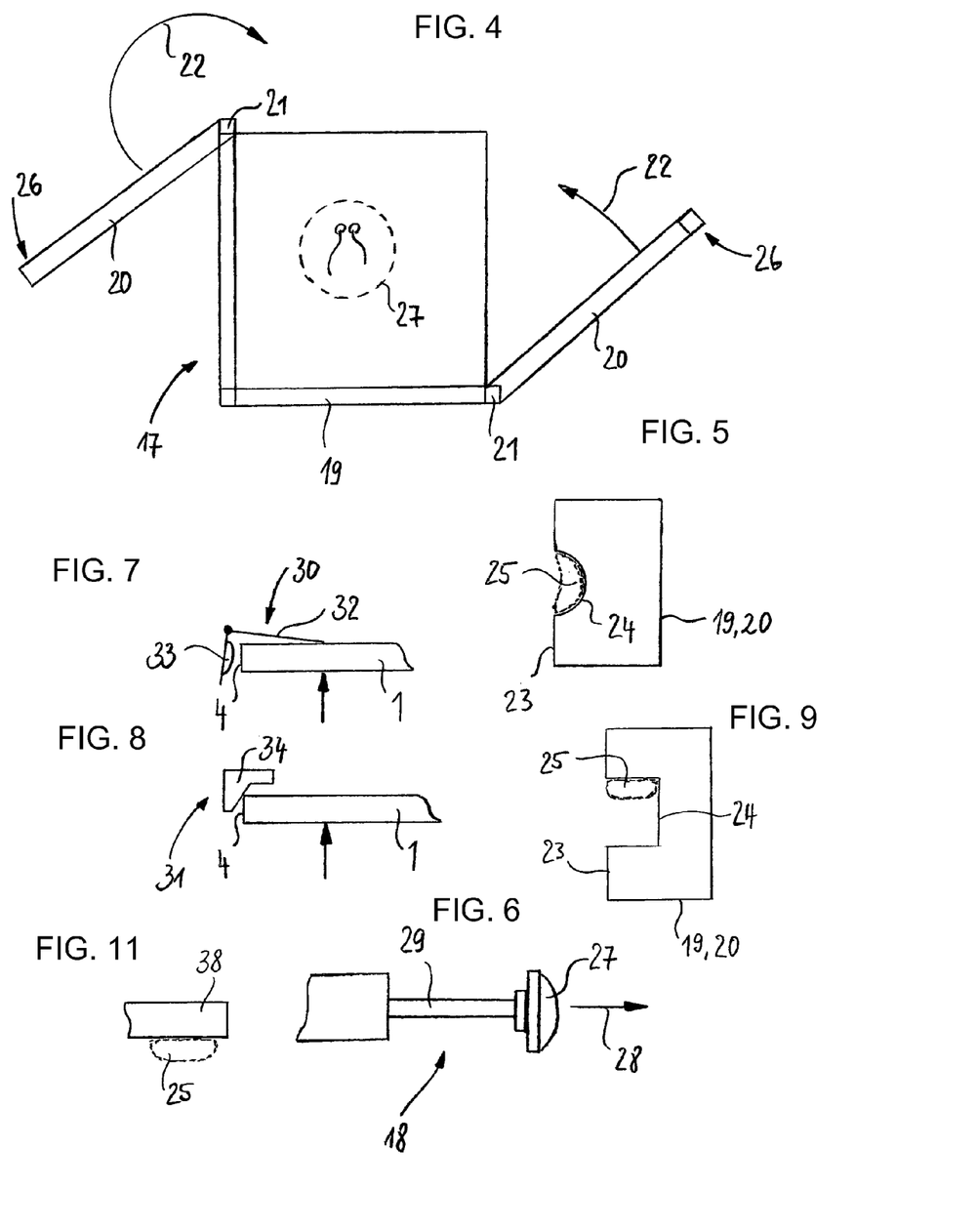
FIG. 4 shows a side view of a photovoltaic module in a contact frame.
FIG. 5 shows a section view through a contact frame.
FIG. 6 shows a side view of a contact stamp.
FIG. 7 shows a partial view of a pivoting lever solution for making contact with the photovoltaic module.
FIG. 8 shows a partial view of a clamping solution for making contact with the photovoltaic module.
FIG. 9 shows a section view of a further contact frame.
FIG. 11 shows a section view through a stamp frame.

The contact frame 17 has contact elements which are in the form of strips and are matched to the external shape of the module 1 to be tested, and is designed to surround the module 1 without any gaps, see FIG. 4. For this purpose, the contact frame 17 is formed from three parts, with an L-shaped part 19 of the frame 17 being provided to correspond to the board shape of the module 1, to which L-shaped part 19 two straight frame elements 20 are attached via hinges 21. First of all, the contact frame 17 is then attached to the module 1 to be tested, by means of the L-shaped element 19. The two further frame elements 20 are then moved to the two remaining sides 4 of the module 1, and make contact with it. This is indicated by the pivoting movements 22 in FIG. 4.

As shown in FIG. 5, the frame elements 19, 20, which are in the form of strips, have a groove 24, in which the contact elements 25 are inserted, on their inside 23 facing the module 1. Three frame elements 19, 20 are therefore used, whose contact elements 25 overlap in their end areas 26. The shape actually used for the groove 24 may differ from the shape illustrated here. It is likewise of relatively little relevance to the invention how the contact elements 25 are mounted in the groove 24. Various options are available to a person skilled in the art here. The only important factor is to ensure that contact is correctly made with the module 1.

The contact stamp 18 is provided with a contact element 27 which is essentially in the form of a ball, and is pressed onto the rear face 2 of the module 1 in the contact-making direction 28, where the electrical connections 3 of the module 3 are exposed, see FIG. 6.

In this case, as is indicated in FIG. 6, the contact element 27 of the contact stamp 18 is mounted at the front end of a cylindrical piston 29. By way of example, the cylindrical piston 29 is driven pneumatically or hydraulic and can be moved in the contact-making direction 28.

Instead of a contact element 27 which is in the form of a ball or cushion, it is also possible to use a flat contact element, as long as this ensures that an electrically adequate contact is made with the module 1, without damage.

The contact elements 25, 27 are preferably composed of an electrically conductive metal fabric, in particular copper-plated or silver-plated mesh fabric, which is applied to an elastomer or foam core.

In the fully automatic variant, the contact frame 17 and the contact stamp 18 are operated automatically and by means of a central control unit, via drive apparatuses which are not shown in the figures, but with which a person skilled in the art will be familiar.

The procedure for an insulation test is described below:

After the module 1 to be tested has entered the test device 13, referencing is carried out first of all. During this process, the position of the module 1 is fixed for the insulation test. Motor-driven referencing elements, for example in the form of beams or the like, in this case move the module 1 to the test position. The module 1 is then insulated. For this purpose, it is raised out of its transport position with the aid of electrically non-conductive plastic elements, and is fed to the contact frame 17. After the frame 17 has been closed and contact has been made with the electrical connections 3 by means of the contact stamp 18, a contact-making test is carried out, which checks whether the contact elements 25, 27 of the contact-making apparatus have been correctly electrically connected to the module edge and to the electrical connections 3 of the module 1 to be tested, and this is followed by the actual insulation test, for which a high-voltage generator is used. After passing over a voltage ramp while at the same time measuring the current which flows through the measurement arrangement in this case, the process determines whether the measured current does or does not satisfy the Standard requirements. In this case, the process of moving over the voltage ramp is carried out within a time period of less than 5 seconds, and preferably within 1 to 2 seconds.

After the insulation test, the connections of the contact frame 17 and contact stamp 18 are shorted, in order to discharge the module 1. As an alternative to this, a high-value resistor in the order of magnitude of 1 to 20 Megohms (or more) can be permanently shorted between the two connecting poles in order to reduce the capacitance; this saves the contactor, which is essentially required for the shorting process mentioned above, for switching the high voltage. The contact frame 17 and contact stamp 18 are then removed from the module 1, and the module 1 is moved back to its transport position. If the transport level has already been designed to be electrically insulated, there is no longer any need to carry out a linear isolation movement. A defined transport position then corresponds to the test position of the module 1.

While the contact-making process has been described above with the aid of a contact frame 17 which has elements 19, 20 which can be pivoted with respect to one another, it is also possible to use contact frames 30, 31 with which contact is made automatically by a movement of the module 1 toward the frame 30, 31. This typically comprises movement of the module from the transport position to the test position.

In this case, on the one hand, a lever pivoting solution can be provided, according to which the module 1 to be tested acts positively on a lever arm 32, which is mounted such that it can pivot, of the contact frame 30 while being moved to the test position, the pivoting of which results in a contact element 33 of the contact frame 30 making contact with the end faces 4, see FIG. 7. A clamping solution is provided in another variant, in which the module 1 to be tested is automatically clamped by the movement to the test position between contact elements 34 of the contact frame 31, see FIG. 8. For clarity reasons, FIGS. 7 and 8 each show only one individual contact-making area. However, contact is preferably made with the entire module 1 at the same time. Contact is made simultaneously between the module 1 and the contact elements 33 and 34 both in the lever pivoting solution and in the clamping solution, for which purpose only a single motor drive is preferably required, with the aid of which the module 1 is moved in the contact-making direction.

Figure 10:
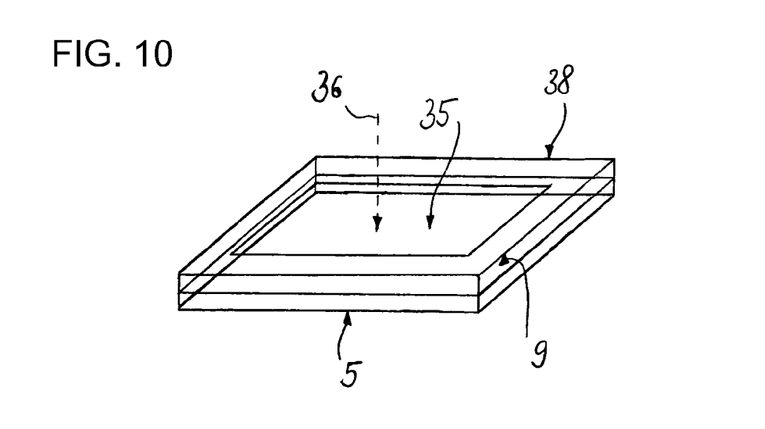
FIG. 10 shows a perspective view of a photovoltaic module with which contact is made by a stamp frame.

According to a further embodiment of the invention, contact is not made with the module edge via the end face 4 of the module 1 but (before lamination) by making contact with the substrate upper face 35 in the area of the module edge 9, see FIGS. 1 and 10, in which case the contact-making direction 36 is illustrated by a dashed line. If a contact frame 17 is used for this way of making contact, the groove 24 and the contact element 25 in this variant are appropriately adapted, see FIG. 9. As an alternative to the use of a contact frame, with this type of contact it is possible to use a further contact stamp 38, which is preferably in the form of a frame—having the fundamental characteristics of the contact frame 17 for making contact with the module 1—and is placed on the substrate 5 in the edge area 9, see FIG. 10. In this case, there is no need to pivot the frame parts since the stamp which is in the form of a frame, or the stamp frame 38, can be designed to be integral, as a result of which it can be placed in its entirety on the module 1 to be tested. If contact is to be made simultaneously with the end face 4 of the substrate 5 and with the substrate upper face 35, then either a modified contact frame 17 or a modified stamp frame 38 can be used for this purpose. In this case, it is likewise possible to use two contact stamps which can be moved separately from one another, in which case one can be moved in the direction of the arrow 22 and the other in the direction of the arrow 36 toward the module 1 to be tested.

It is not significant for the invention whether the mechanical contact-making apparatus is moved toward the stationary module 1 or whether module 1 is moved toward the stationary mechanical contact-making apparatus, or whether a mixed form is implemented.

While the contact element 27 of the contact stamp 18 is preferably in the form of a ball in order to ensure an adequate electrical contact with the module 1, the contact element of the contact frame 17, 30, 31 may assume various shapes, for example the shape of a semicircular strip 25 (see FIG. 5), the shape of a ball 33 (FIG. 7) or 25 (FIG. 9) or the shape of a wedge 34 (FIG. 8). If contact is made simultaneously with the end face 4 and the substrate upper face 35 (this variant is not illustrated in the drawings), L-shaped contact elements are also possible. Furthermore, the contact frame 17 may also be formed from a combination of individual contact stamps or contact stamps combined with one another.

All of the features mentioned in the description, in the subsequent claims and illustrated in the drawing may be essential to the invention both individually and in any desired combination with one another.

LIST OF REFERENCE SYMBOLS

1 Photovoltaic module
2 Rear face
3 Electrical connection
4 Module end face
5 Substrate
6 Current-carrying component
7 Semiconductor layer
8 TCO layer
9 Edge area
10 Laminate
11 Cover plate
12 Production line
13 Device
14 Process direction
15 Edge de-coating module
16 Lamination module
17 Contact frame
18 Contact stamp
19 L-shaped frame element
20 Straight frame element
21 Hinge
22 Pivoting movement
23 Inside
24 Groove
25 Contact element
26 End area
27 Contact element
28 Contact-making direction
29 Cylindrical piston
30 Contact frame
31 Contact frame
32 Lever arm
33 Contact element
34 Contact element
35 Substrate upper face
36 Contact-making direction
37 (Spare)
38 Stamp frame

The invention claimed is:

1. A method for testing electrical insulation of photovoltaic modules, the method comprising the following steps:
   during an electrical test, bringing a mechanical contact-making apparatus into mechanical contact with a photovoltaic module along a module edge of the photovoltaic module and into mechanical contact with electrical connections of the photovoltaic module which lead outside of the photovoltaic module at a distance from the module edge; and
   applying a test voltage with the mechanical contact-making apparatus between the module edge and the electrical connections of the photovoltaic module.

2. A method for improving the insulation characteristics of photovoltaic modules having current-carrying components arranged on a substrate in the form of a board and being electrically insulated in an area of a module edge, the method comprising the following steps:
   during an electrical insulation test according to claim 1, applying the test voltage in a range from about 8 kV to about 20 kV.

3. A method for producing photovoltaic modules having current-carrying components arranged on a substrate in the form of a board and being electrically insulated in an area of a module edge, the method comprising the following steps:
   performing an electrical insulation test according to claim 1 during production of the photovoltaic modules.

4. The method according to claim 3, wherein testing is carried out on a production line in series with or during at least one other production step.

5. The method according to claim 3, wherein each photovoltaic module is tested for electrical insulation.

6. The method according to claim 3, wherein the testing of electrical insulation is carried out after the current-carrying components have been mounted on the substrate and the substrate has been de-coated a second time, and before the current-carrying components in an area of the module edge are electrically insulated.

7. A device for use in testing electrical insulation of photovoltaic modules, each module having current-carrying components arranged on a board-shaped substrate electrically insulated in an area of a module edge, the device comprising;
   a mechanical contact-making apparatus for applying a test voltage between the module edge and electrical connections being located at a distance from said module edge extending outside of the module, said mechanical contact-making apparatus including a contact frame having at least one contact element in the form of a strip for contact with the module edge.

8. The device according to claim 7, wherein said contact frame is constructed and arranged to surround the module.

9. The device according to claim 7, wherein said mechanical contact-making apparatus includes a contact stamp which has a ball-shaped contact element for contact with the electrical connections.

10. The device according to claim 7, wherein said mechanical contact-making apparatus includes a contact frame which has at least one contact element that comprises at least one of an electrically conductive fabric or electrically conductive fibers.

11. The device according to claim 7, wherein said mechanical contact-making apparatus includes a contact frame, which has at least one contact element that has metered moistening.

12. The device according to claim 7, wherein said electrical connections have at least one of a connecting socket or connecting plug, and said mechanical contact-making apparatus has a plug-in contact adapter for contact with said at least one of a connecting socket or connecting plug.

13. The device according to claim 12, wherein said mechanical contact-making apparatus has an auxiliary apparatus to automatically electrically connect between said at least one of a connecting socket or connecting plug and said contact adapter.

14. A system for producing thin-film photovoltaic modules having current-carrying components arranged on a board-shaped substrate, said substrate being electrically insulated in an area of a module edge of said substrate, comprising:

a device according to claim 7 for carrying out an electrical insulation test of said modules.

15. The method according to claim 1, wherein the photovoltaic modules are thin-film photovoltaic modules in which current-carrying components are arranged on a substrate in the form of a board and are electrically insulated in an area of the module edge.

* * * * *